(12) United States Patent
McLaurin et al.

(10) Patent No.: US 6,999,900 B2
(45) Date of Patent: Feb. 14, 2006

(54) TESTING MEMORY ACCESS SIGNAL CONNECTIONS

(75) Inventors: Teresa Louise McLaurin, Austin, TX (US); Frank David Frederick, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 10/812,309

(22) Filed: Mar. 30, 2004

(65) Prior Publication Data

US 2005/0222809 A1 Oct. 6, 2005

(51) Int. Cl.
*G06F 19/00* (2006.01)

(52) U.S. Cl. ............... 702/183; 702/117; 702/118; 714/727; 714/734; 714/718

(58) Field of Classification Search ......... 702/117, 702/118, 120, 122; 324/537, 763, 765; 714/724, 714/726, 727, 729, 733, 734, 718; 365/201
See application file for complete search history.

(56) References Cited

U.S. PATENT DOCUMENTS

| | | | | | |
|---|---|---|---|---|---|
| 5,355,083 | A | * | 10/1994 | George et al. ............... | 324/229 |
| 5,541,510 | A | * | 7/1996 | Danielson .................... | 324/233 |
| 6,446,230 | B1 | * | 9/2002 | Chung ........................ | 714/726 |
| 6,484,280 | B1 | * | 11/2002 | Moberly ..................... | 714/726 |
| 6,556,037 | B1 | * | 4/2003 | Shiraishi ..................... | 324/765 |
| 6,560,739 | B1 | * | 5/2003 | Chung ........................ | 714/726 |
| 6,598,192 | B1 | * | 7/2003 | McLaurin et al. .......... | 714/726 |
| 6,678,875 | B1 | * | 1/2004 | Pajak et al. .................. | 716/11 |
| 6,686,759 | B1 | * | 2/2004 | Swamy ....................... | 324/765 |
| 6,810,498 | B1 | * | 10/2004 | Shimizu ..................... | 714/726 |
| 6,813,739 | B1 | * | 11/2004 | Grannis, III ................ | 714/729 |
| 6,851,079 | B1 | * | 2/2005 | Hergott ...................... | 714/724 |
| 2002/0035442 | A1 | | 3/2002 | Dervisoglu et al. ......... | 702/120 |
| 2002/0040458 | A1 | | 4/2002 | Dervisoglu et al. ......... | 714/729 |
| 2002/0133807 | A1 | * | 9/2002 | Sluiman ..................... | 717/124 |
| 2002/0184582 | A1 | | 12/2002 | Pouya et al. ................ | 714/726 |
| 2002/0184583 | A1 | | 12/2002 | Hikone et al. .............. | 714/726 |
| 2003/0056163 | A1 | | 3/2003 | Rajsuman et al. .......... | 714/724 |
| 2003/0120986 | A1 | | 6/2003 | Whetsel ..................... | 714/724 |
| 2003/0149949 | A1 | | 8/2003 | Price et al. ................... | 716/4 |
| 2003/0191996 | A1 | | 10/2003 | Mukherjee et al. ......... | 714/724 |
| 2004/0054948 | A1 | * | 3/2004 | McLaurin et al. .......... | 714/726 |
| 2004/0128596 | A1 | | 7/2004 | Menon et al. .............. | 714/724 |
| 2004/0153915 | A1 | * | 8/2004 | McLaurin .................... | 714/724 |
| 2004/0187058 | A1 | | 9/2004 | Yamada et al. ............. | 714/726 |
| 2004/0237015 | A1 | * | 11/2004 | Abdel-Hafez et al. ...... | 714/726 |
| 2004/0268181 | A1 | * | 12/2004 | Wang et al. ................. | 714/30 |

OTHER PUBLICATIONS

McLaurin, "IEEE Std. 1500 Compliant Wrapper Boundary Register Cell", obtained from www.arm.com dated Jun. 15, 2005.*

McLaurin et al., "ETM10 Incorporates Hardware Segment of IEEE P1500", IEEE, 2002.*

(Continued)

*Primary Examiner*—Patrick J. Assouad
(74) *Attorney, Agent, or Firm*—Nixon & Vanderhye P.C.

(57) ABSTRACT

In order to test the memory access signal connections between a data processing circuit, such as a processor core 2, and a memory 4, a subset of memory access signal connections 8 are provided with associated scan chain cells 10 so that they may be directly tested. The remainder memory access signal connections 12 which are common to all the expected configurations of the memory 4 are tested by being driven by the processor core 2 itself with data being passed through the memory and captured back within the processor core 2 for checking.

20 Claims, 3 Drawing Sheets

OTHER PUBLICATIONS

McLaurin et al., "The Testability Features of the MCF5407 Containing the 4th Generation ColdFire Microprocessor Core", IEEE, 2000.*

McLaurin et al., "On-the-Shelf Core Pattern Methodology for ColdFire Microprocessor Cores", IEEE 2000.*

Crouch et al., "The Testability Features of the 3$^{rd}$ Generation ColdFire Family of Microprocessors", IEEE, 1999.

Crouch et al., "Test Development for a Third Version ColdFire Microprocessor", IEEE, 2000.

* cited by examiner

TESTING MEMORY ACCESS SIGNAL CONNECTIONS

BACKGROUND OF THE INVENTION

1. Field of the Invention

This invention relates to data processing systems. More particularly, this invention relates to the testing of memory access signal connections between a data processing circuit and a memory coupled to that data processing circuit.

2. Description of the Prior Art

It is known to provide testing mechanisms for testing integrated circuits when they have been manufactured to ensure that they operate correctly. One known technique is to include serial scan chains into which test patterns, such as automatically generated test patterns (AGTPs), may be scanned in and result values scanned out to verify correct operation of the manufactured integrated circuits. As integrated circuits increase in complexity and have an increasing number of functional units embedded therein, the need for test in this way increases and the difficulty of gaining access to deeply embedded portions of the integrated circuit with no direct connection to the external pins of the integrated circuit also increases. These problems are further compounded in that different functional elements within the integrated circuit may be designed and produced by different suppliers who may not release full details of the design of their functional unit as this is proprietary information. This makes the design of appropriate test patterns to provide comprehensive test coverage more difficult.

In the above circumstances, one possibility is that the provider of the functional unit, such as a processor core, will also supply appropriate test patterns for testing that functional unit when it is integrated within a larger integrated circuit (system-on-chip) design. Whilst this approach works well in many cases, a difficulty arises when the particular functional unit may be connected to a variety of different forms of additional circuitry which necessitate different test patterns to be used. In this context, the functional unit provider can try to produce a suite of test patterns to cover all possible ways in which the functional unit may be used, but this is an onerous undertaking. As an example of this circumstance, a processor core may have a memory access port to which a memory of a variable size can be connected or optionally no memory at all connected. In order to test the memory access signal connections between the processor core and the memory, it would be possible to provide each of these signal connections with a scan chain cell such that test pattern data could be applied to and captured from these points. This would allow the connections to be tested without dependence upon the connected memory size. However, the memory access signal connections are often timing critical signal paths and the additional delay that may be introduced by inserting a multiplexer in these paths so as to accommodate a scan chain cell is a significant disadvantage. Furthermore, significant circuit area is consumed by scan chain cells and so it is desirable if possible to reduce these in number. It is known within test methodologies to control a data processing circuit with appropriately applied diagnostic signals such that it will exercise the memory access signal connections for a particular size of attached memory with the results of these stimulations being observed to ensure correct operation by checking the data fed back into the data processing circuit. However, such techniques are memory size specific and accordingly in order to deal with a variety of possible different memory sizes which may be attached, a disadvantageously large number of suitable test patterns need to be provided.

SUMMARY OF THE INVENTION

Viewed from one aspect the present invention provides a method of testing an apparatus for processing data having a memory operable to store data and a data processing circuit coupled to said memory via a memory access port having a plurality of memory access signal connections, said method comprising the steps of:

testing a subset of said plurality of memory access signal connections using respective associated diagnostic serial scan chain cells each operable to perform at least one of:
(i) applying a diagnostic signal value to a respective memory access signal connection of said subset; and
(ii) capturing a diagnostic signal value from said respective memory access signal connection of said subset; and testing a remainder of said plurality of memory access signal connections by at least one of:
(iii) outputting a diagnostic signal generated by said data processing circuit to said memory from said data processing circuit via a respective memory access signal connection of said remainder; and
(iv) capturing with said data processing circuit a diagnostic signal input to said data processing circuit from said memory via a respective memory access signal connection of said remainder.

The invention recognizes and exploits the feature that whilst memory size will vary (or a memory may not be present at all) and accordingly make some memory access signal connections optional or changed between different memory size implementations, a large number of these memory access signal connections will remain unchanged. Thus, the system may be arranged to use scan chain cells on those memory access signal connections which are variable between different implementations to allow these to be separately tested by their own test pattern whereas the memory access signal connections which are common between different implementations may be tested by being exercised by the data processing circuit concerned and the responses therefrom observed. In this way, there is a reduced requirement for scan chain cells in the integrated circuit as a whole and on the potentially timing limiting critical paths of the memory access signal connections. Furthermore, the number of different test patterns which need to be provided is reduced to a more acceptable level.

In preferred embodiments of the invention, the subset of memory access signal connections which are provided with scan chain cells are ones from which diagnostic signal data is captured but does not need to be applied by scan chain cell mechanisms. Scan chain cells which only capture data need not utilize a multiplexer in the critical data path so reducing the timing constraints which can be introduced by scan chain cell insertion. Memory access signal connections of the type from which data is normally only required to be captured include memory address signal connections.

These are of the type which tend to be optionally used and present depending upon memory size used, which is one of the major variables in the form of the overall integrated circuit.

The provision of serial scan chain cells is not however limited to such memory address signal lines, as there are other signal lines which may optionally be present, which are not timing critical and which may be used with serial scan chain cells which apply diagnostic signals rather than merely capture diagnostic signals.

It will be appreciated that the data processing circuit coupled to the memory could take a wide variety of different forms, such as a digital signal processor, a data engine or the like. However, the present technique is particularly well suited to embodiments in which the data processing circuit is a processor core.

Similarly, it will be appreciated that the memory coupled to the data processing circuit could take a variety of forms such as a main memory, a cache memory or the like. However, the present technique is particularly well suited to situations in which the memory is a tightly coupled memory.

The testing of the remainder of the memory access connections with data driven out to and captured back from the memory is facilitated by manipulating one or more memory size signals which indicate the size of the memory that is present. The memory may have a range of optional sizes, but this type of testing, and the consequent need for an appropriate test pattern, can be restricted to the smallest non-zero memory size that is supported. The memory size signals are changed, possibly using pin signals, but preferably using serial scan chain derived signals, to specify a smaller memory than is in reality present. The non-scan cell testing can then be restricted to the smaller memory size.

Viewed from another aspect the present invention provides apparatus for processing data, said apparatus comprising:
 a memory operable to store data; and
 a data processing circuit coupled to said memory via a memory access port having a plurality of memory access signal connections; wherein
 a subset of said plurality of memory access signal connections have respective associated diagnostic serial scan chain cells operable to perform at least one of:
  applying a diagnostic signal value to a respective memory access signal connection; and
  capturing a diagnostic signal value from said respective memory access signal connection; and
 a remainder of said plurality of memory access signal connections do not have respective associated diagnostic serial scan chain cells.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
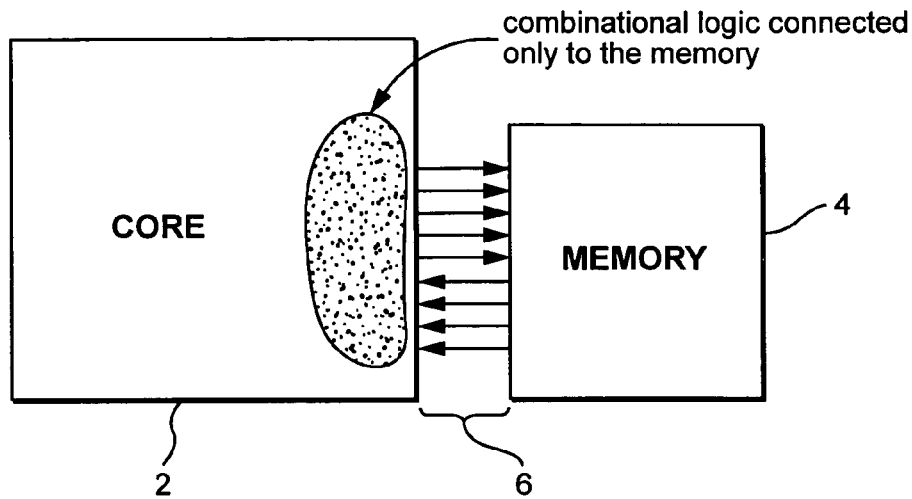
FIG. 1 schematically illustrates a processor core coupled via a memory access port to a memory.

FIG. 1 shows a portion of an integrated circuit including a processor core 2 and a memory 4. Combinatorial logic within the processor core 2 is connected to the memory access port 6 and does not connect to other portions of the system to enable it to be otherwise tested. The memory 4 can vary in size depending upon the particular requirements of the system concerned (in some systems no memory may be present) and such variation in size can have an impact upon the precise form of the memory access port 6 and the memory access signal connections utilized. Accordingly, running a test operation upon the processor core 2 to exercise the memory access port 6 does not enable different sizes of memory 4 to be tested and would require different test pattern sets to be generated to stimulate the processor core 2 appropriately so as to accommodate all the different memory sizes possible for the memory 4. Memory size signals, which are usually tied during instantiation of a particular integrated circuit, are used to specify which particular optional memory size is present.

Figure 2:
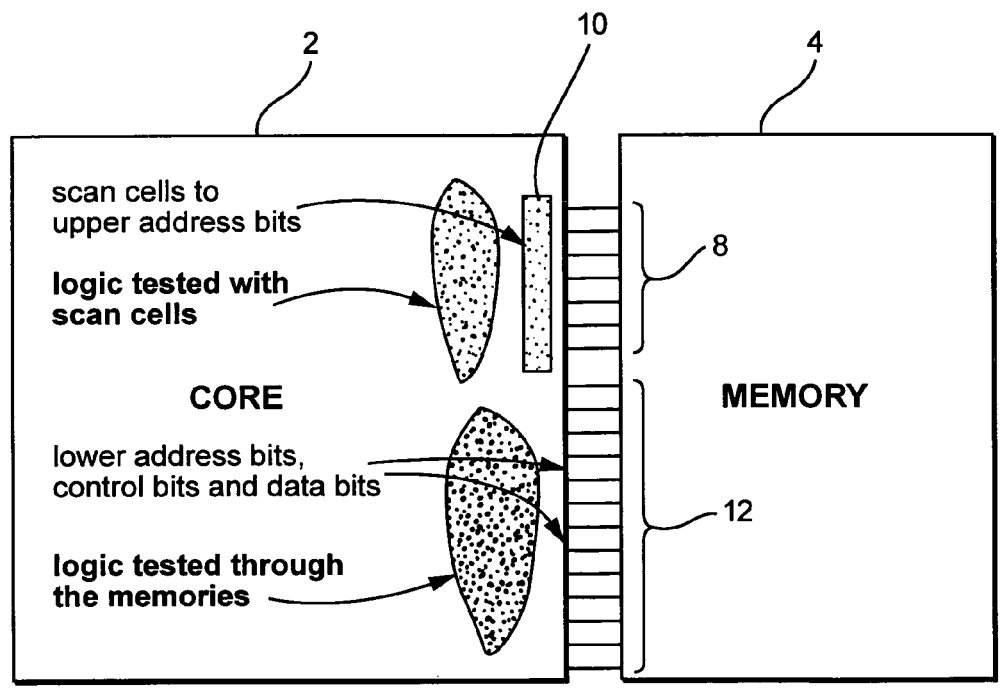
FIG. 2 schematically illustrates the system of FIG. 1 in more detail showing the different test treatment of different portions of the memory access port.

FIG. 2 illustrates the system of FIG. 1 in more detail, but in this case the memory access signal connections between the processor core 2 and the memory 4 are divided into a subset 8 which are provided with respective serial scan chain cells 10 and a remainder 12 which are tested by diagnostic signals driven out from the processor core 2 or captured back by the processor core 2. The remainder portion 12 is thus tested by signals driven through the memory 4 rather than relying upon the capabilities of serial scan chain cells 10 which can test these connections without requiring the memory 4 itself to participate in the testing operation. The remainder portion 12 corresponds to the smallest supported non-zero memory size as specified by changed memory size signals used during testing. These changed memory size signals are derived from scan cell signals input during test and used to override the true memory size signals specifying the operational memory size for use during non-test operation. Thus, as part of enabling only the remainder portion 12 to require a test pattern, the integrated circuit is supplied with memory size signals specifying a smaller memory than is actually present and one for which the memory access connections may be tested using the single (or small number) of test pattern that need be provided.

The subset of memory access signal connections 8 which are provided with serial scan chain cells 10 typically includes the high order memory address signal lines as these are ones which tend optionally to be used depending upon the memory size of the memory 4 being employed by a particular implementation. Accordingly, taking the variability of the use or non-use of these high order memory address signal lines out of the factors controlling the need to provide different test patterns reduces the number of test patterns required. Certain control signals which form part of the memory access signal connections may also be subject to optional use depending upon the type of memory 4 being used or the size of the memory 4 being used. These control signals could also be supplied with a suitable scan chain cell for direct testing.

The high order memory address signal lines are such that it is normally only desired to test data being driven out to these lines. Indeed, in normal operation the signal flow is normally always from the processor core 2 to the memory 4 for memory address signal lines.

Figure 3:
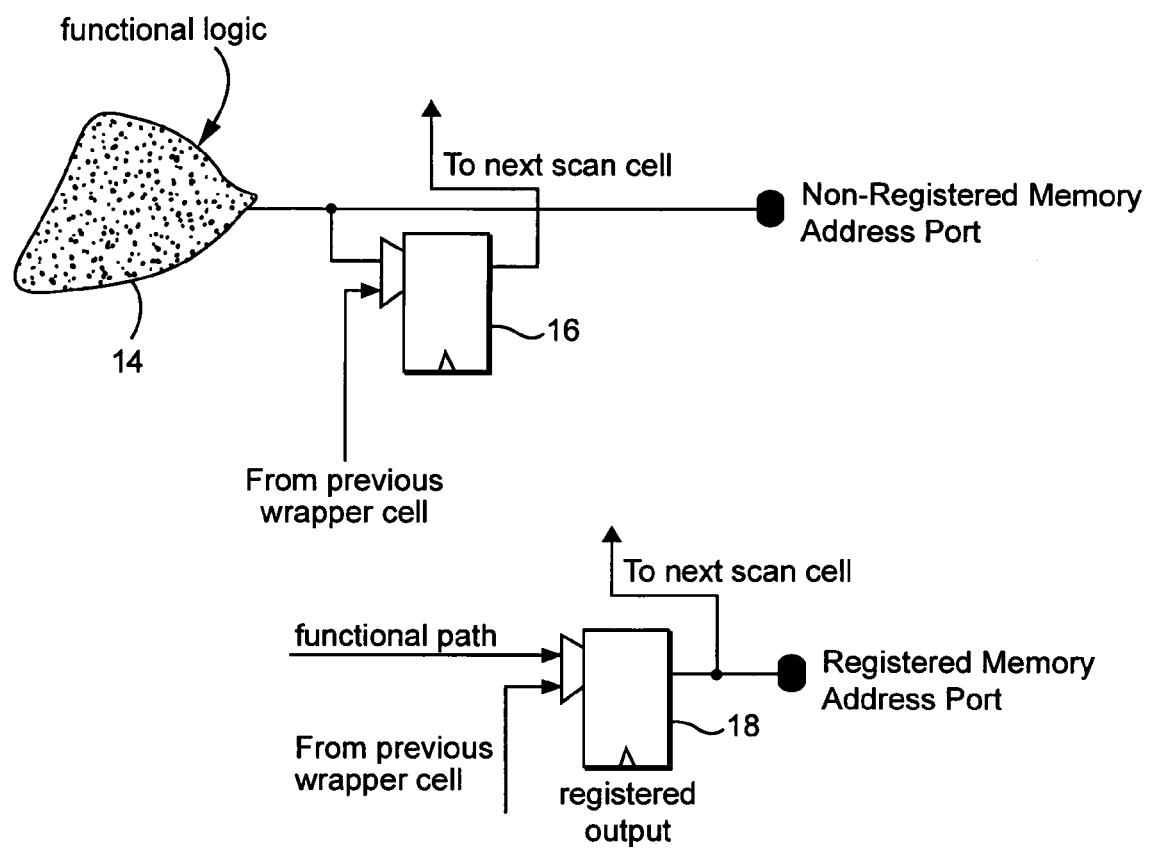
FIG. 3 schematically illustrates two different types of scan chain cell which may be used on memory access signal connections in accordance with the present technique.

FIG. 3 schematically illustrates two scan chain cell arrangements which may be used with the subset of connections for which scan chain cells are provided. The upper example is a non-registered memory address port signal line from which it is only desired to capture diagnostic signals generated by the functional logic 14 within the processor core 2. This may be achieved with a scan chain cell 16 having an input selectively connected to the memory address port signal line without requiring a multiplexer to be inserted into that signal line functional path. The lower example is of a registered memory address port signal line. The register 18 for such a registered signal line can be reused as the serial scan chain cell for diagnostic purposes.

Figure 4:
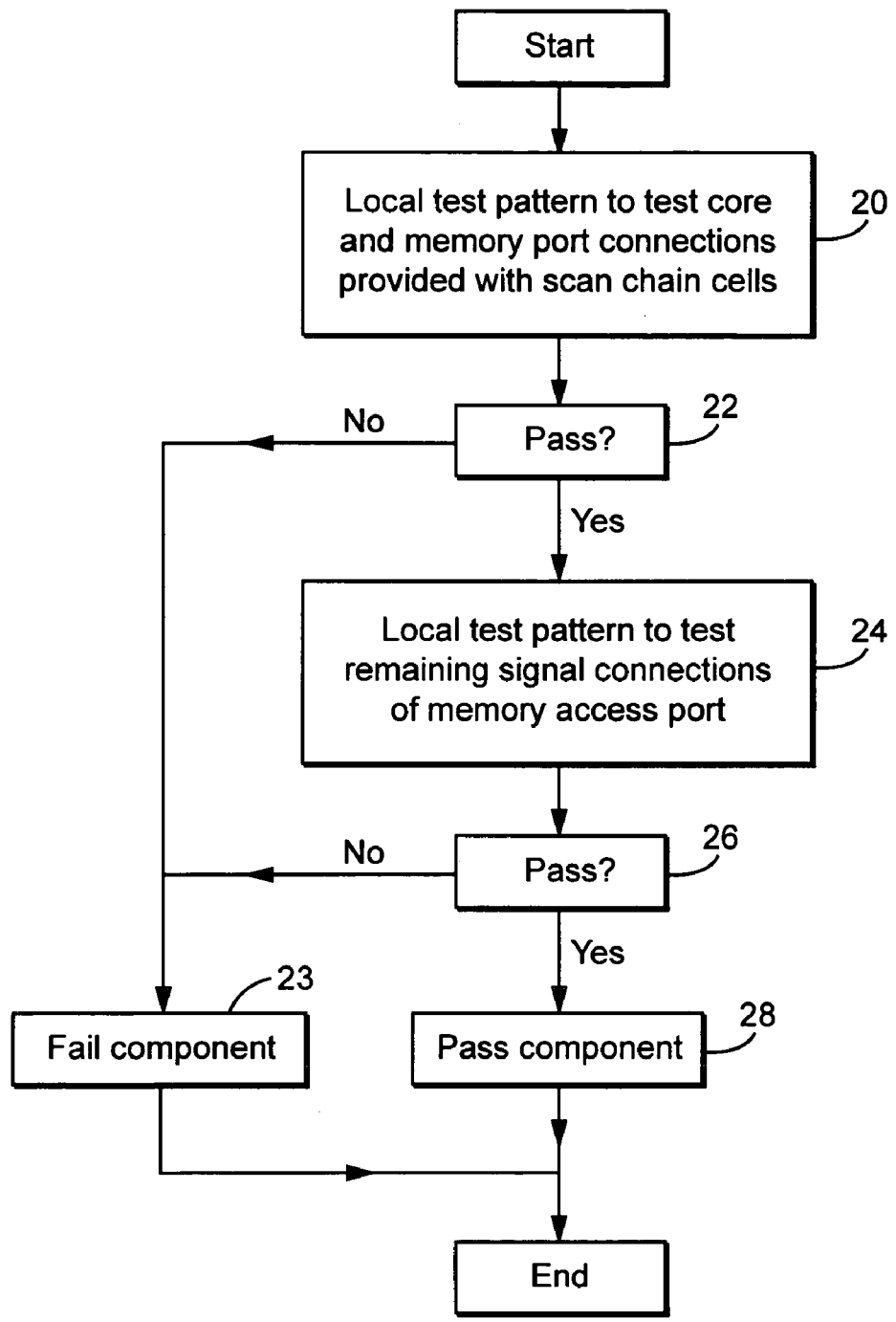
FIG. 4 is a flow diagram schematically illustrating a test methodology utilizing the present techniques.

FIG. 4 is a flow diagram schematically illustrating a testing methodology for the system of FIG. 2. At step 20 a test pattern is loaded using a serial scan chain (such as the wrapper scan chain) to test the processor core 2 and those memory port connections 8 which are provided with scan chain cells, e.g. high order address bits of the memory access port connecting to the optional memory. The memory size signals are also toggled during this testing to check these signals. The memory port connections with scan cells are tested by driving signals out of the processor core 2 for capture in the scan chain cells 10 under the test pattern control. Step 22 serves to determine whether or not this phase of the testing is passed. If the test is not passed, then processing proceeds to step 23 at which the component is failed. If the check for a pass at step 22 is successful, then processing proceeds to step 24 at which an appropriate test pattern is driven into the processor core 2 to test the remaining memory access port connections (if a memory is actually connected) by driving signals out of the processor core 2, through the memory 4 and back into the processor core 2 under test pattern control. Whilst this testing is taking place the memory size signals are set to have values such that the memory (if present) is taken to have the smallest non-zero supported memory size. Step 26 then determines whether or not this test has been passed. If the test has not been passed, then the component is again failed at step 23. If the test at step 26 indicates a pass of the second phase of the testing, then processing proceeds to step 28 at which the component concerned is passed and maybe released for use. If an optional memory is not present the steps 24 and 26 can be omitted.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. A method of testing an apparatus for processing data having a memory operable to store data and a data processing circuit coupled to said memory via a memory access port having a plurality of memory access signal connections, said method comprising the steps of:
   testing a subset of said plurality of memory access signal connections using respective associated diagnostic serial scan chain cells each operable to perform at least one of steps (i) and (ii):
   (i) applying a diagnostic signal value to a respective memory access signal connection of said subset; and
   (ii) capturing a diagnostic signal value from said respective memory access signal connection of said subset; and
   testing a remainder of said plurality of memory access signal connections by at least one of steps (iii) and (iv):
   (iii) outputting a diagnostic signal generated by said data processing circuit to said memory from said data processing circuit via a respective memory access signal connection of said remainder; and
   (iv) capturing with said data processing circuit a diagnostic signal input to said data processing circuit from said memory via a respective memory access signal connection of said remainder.

2. A method as claimed in claim 1, wherein said subset includes memory access signal connections which are optionally present within said memory access port in dependence upon a memory size of said memory.

3. A method as claimed in claim 1, wherein said subset includes memory address signal connections from which a diagnostic signal is captured.

4. A method as claimed in claim 1, wherein said data processing circuit includes at least one serial scan chain cell operable to control said data processing circuit to generate respective diagnostic signals output by said data processing circuit to said memory.

5. A method as claimed in claim 1, wherein said data processing circuit includes at least one serial scan chain cell operable to control said data processing circuit to capture respective diagnostic signals input to said data processing circuit from said memory.

6. A method as claimed in claim 1, wherein said data processing circuit is a processor core.

7. A method as claimed in claim 1, wherein said memory is a tightly coupled memory.

8. A method as claimed in claim 1, wherein said memory has an operational memory size larger that a smallest optional memory size and one or more memory size signals serve to indicate a memory size of said memory, said memory size signals being changed during testing to indicate a test memory size for use when testing said remainder of said plurality of memory access signal connection, said test memory size being smaller than said operational memory size of said memory used during non-test operation.

9. A method as claimed in claim 8, wherein said test memory size is a smallest non-zero memory size which is supported.

10. A method as claimed in claim 8, wherein said memory size signals are changed during testing using signals from one or more serial scan chain cells.

11. Apparatus for processing data, said apparatus comprising:
   a memory operable to store data; and
   a data processing circuit coupled to said memory via a memory access port having a plurality of memory access signal connections; wherein
   a subset of said plurality of memory access signal connections have respective associated diagnostic serial scan chain cells operable to perform at least one of:
   applying a diagnostic signal value to a respective memory access signal connection; and
   capturing a diagnostic signal value from said respective memory access signal connection; and
   a remainder of said plurality of memory access signal connections do not have respective associated diagnostic serial scan chain cells.

12. Apparatus as claimed in claim 11, wherein said subset includes memory access signal connections which are optionally present within said memory access port in dependence upon a memory size of said memory.

13. Apparatus as claimed in claim 11, wherein said subset includes memory address signal connections from which a diagnostic signal is captured.

14. Apparatus as claimed in claim 11, wherein said data processing circuit includes at least one serial scan chain cell operable to control said data processing circuit to generate respective diagnostic signals output by said data processing circuit to said memory.

15. Apparatus as claimed in claim 11, wherein said data processing circuit includes at least one serial scan chain cell operable to control said data processing circuit to capture respective diagnostic signals input to said data processing circuit from said memory.

16. Apparatus as claimed in claim 11, wherein said data processing circuit is a processor core.

17. Apparatus as claimed in claim 11, wherein said memory is a tightly coupled memory.

18. Apparatus as claimed in claim 11, wherein said memory has an operational memory size larger that a smallest optional memory size and one or more memory size signals serve to indicate a memory size of said memory, said memory size signals being changed during testing to indicate a test memory size for use when testing said remainder of said plurality of memory access signal connection, said test memory size being smaller than said operational memory size of said memory used during non-test operation.

19. Apparatus as claimed in claim 18, wherein said test memory size is a smallest non-zero memory size which is supported.

20. Apparatus as claimed in claim 18, wherein said memory size signals are changed during testing using signals from one or more serial scan chain cells.

* * * * *